United States Patent
Li et al.

(10) Patent No.: US 8,344,767 B2
(45) Date of Patent: Jan. 1, 2013

(54) LOW POWER POWER-ON-RESET (POR) CIRCUIT

(75) Inventors: Dong Li, Shanghai (CN); Hai Tao, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 154 days.

(21) Appl. No.: 12/904,702

(22) Filed: Oct. 14, 2010

(65) Prior Publication Data

US 2012/0092046 A1 Apr. 19, 2012

(51) Int. Cl.
*H03L 7/00* (2006.01)
(52) U.S. Cl. .............................. 327/143; 327/75; 327/77
(58) Field of Classification Search .................... 327/75, 327/76, 77, 87, 143, 198
See application file for complete search history.

(56) References Cited

U.S. PATENT DOCUMENTS

| 4,446,381 | A | * | 5/1984 | Dalrymple | 327/143 |
| 5,109,163 | A | | 4/1992 | Benhamida | |
| 5,177,375 | A | | 1/1993 | Ogawa et al. | |
| 6,005,423 | A | | 12/1999 | Schultz | |
| 2007/0170962 | A1 | | 7/2007 | Wu | |
| 2009/0160505 | A1 | * | 6/2009 | Rho | 327/143 |

* cited by examiner

*Primary Examiner* — Long Nguyen
(74) *Attorney, Agent, or Firm* — Brake Hughes Bellermann LLP

(57) ABSTRACT

In one general aspect, an apparatus can include a first voltage detect circuit configured to produce an output signal at a first power supply voltage, and configured to be in a non-monitoring state at a second power supply voltage greater than the first power supply voltage. The apparatus can include a second voltage detect circuit configured to change from a non-monitoring state to a monitoring state and configured to produce an output signal at a third power supply voltage between the first power supply voltage and the second power supply voltage. The apparatus can also include a combination circuit configured to produce a power-on-reset signal based on a logical combination of the output signal produced by the first voltage detect circuit and the output signal produced by the second voltage detect circuit.

33 Claims, 8 Drawing Sheets

LOW POWER POWER-ON-RESET (POR) CIRCUIT

TECHNICAL FIELD

This description relates to a low power power-on-reset circuit.

BACKGROUND

Many known power-on-reset circuits have limitations that can reduce the effectiveness of these power-on-reset circuits in monitoring a power supply voltage for a target circuit. Some known power-on-reset circuits may not assert a power-on-reset signal with rising and/or falling power supply voltage ramps in a desirable fashion. Also, some known power-on-reset circuits may not monitor the power supply voltages at discrete threshold voltages and will instead deassert a power-on-reset signal after a specified period of time has elapsed regardless of the power voltage supply level. In such power-on-reset circuits, if the power supply voltage rises at a relatively slow rate, the power-on-reset circuit and target circuit may not operate in a desirable fashion. Some known power-on-reset circuits also may not assert a power-on-reset signal reset in a reliable fashion when the power supply voltage cycles at a relatively high rate, and/or is noisy. Thus, a need exists for systems, methods, and apparatus to address the shortfalls of present technology and to provide other new and innovative features.

SUMMARY

In one general aspect, an apparatus can include a first voltage detect circuit configured to produce an output signal at a first power supply voltage, and configured to be in a non-monitoring state at a second power supply voltage greater than the first power supply voltage. The apparatus can include a second voltage detect circuit configured to change from a non-monitoring state to a monitoring state and configured to produce an output signal at a third power supply voltage between the first power supply voltage and the second power supply voltage. The apparatus can also include a combination circuit configured to produce a power-on-reset signal based on a logical combination of the output signal produced by the first voltage detect circuit and the output signal produced by the second voltage detect circuit.

In another general aspect, an apparatus can include a first voltage detect circuit including a first p-channel diode connected MOSFET device having a drain coupled to a drain of a first n-channel MOSFET device. The first n-channel MOSFET device can have a gate coupled to a high threshold NAND circuit. The apparatus can include a second voltage detect circuit including a second p-channel diode connected MOSFET device and having a gate of a second n-channel MOSFET device coupled to a bias generation circuit. The apparatus can also include a logical combination circuit configured to produce a power-on-reset signal based on a logical combination of a first output signal produced by the first voltage detect circuit based on a power supply voltage and a second output signal produced by the second voltage detect circuit based on the power supply voltage.

In another general aspect, a method can include producing, using a power-on-reset circuit, a power-on-reset signal having an asserted value when a power supply voltage exceeds a functional threshold voltage. The method can also include changing the power-on-reset signal from the asserted value to a deasserted value in response to the power supply voltage exceeding a first transition voltage associated with a first voltage detect circuit of the power-on-reset circuit and exceeding a second transition voltage associated with a second voltage detect circuit of the power-on-reset circuit.

The details of one or more implementations are set forth in the accompanying drawings and the description below. Other features will be apparent from the description and drawings, and from the claims.

DETAILED DESCRIPTION

Figure 1:
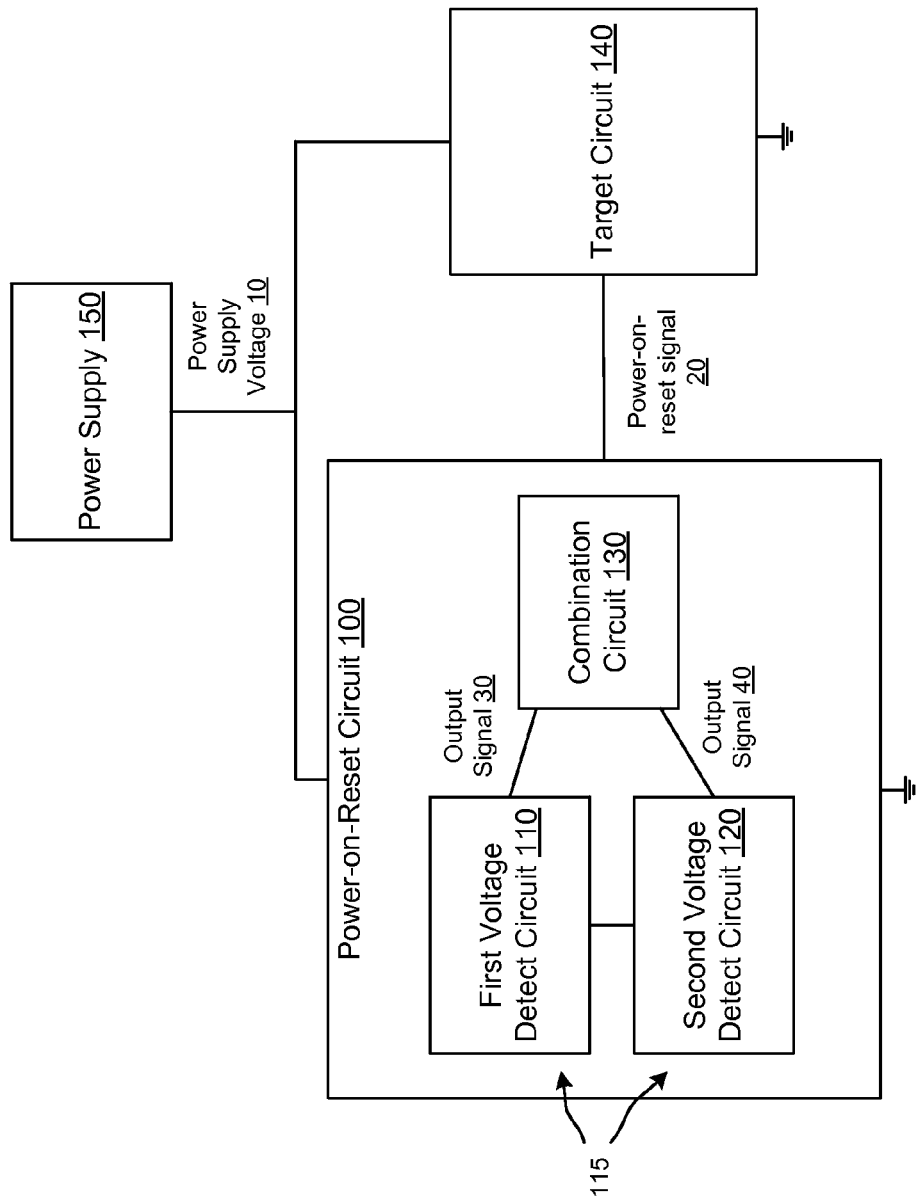
FIG. 1 is a block diagram that illustrates a power-on-reset circuit that includes a first voltage detect circuit and a second voltage detect circuit.

FIG. 1 is a block diagram that illustrates a power-on-reset circuit 100 that includes a first voltage detect circuit 110 and a second voltage detect circuit 120. As shown in FIG. 1, the power-on-reset circuit 100 is operatively coupled to a target circuit 140. Both the power-on-reset circuit 100 and the target circuit 140 are configured to receive power from a power supply 150.

Because a power supply voltage 10 that is produced (e.g., output) by the power supply 150 can fluctuate (e.g., increase, decrease, turn on, turn off, be disturbed momentarily), the power-on-reset circuit 100 is configured to assert a power-on-reset signal 20 (via connection 20) that causes the target circuit 140 to remain in a known state (e.g., a reset state) until the power supply voltage 10 is at a desirable level (e.g., at a high enough energy level that the target circuit 140 can operate in a desirable fashion). After the power supply voltage 10 produced by the power supply 150 is at a desirable level, the power-on-reset circuit 100 can be configured to deassert the power-on-reset signal 20.

Throughout this Detailed Description, when a signal, such as the power-on-reset signal 20, is asserted, the signal can have a first value, and when the signal is deasserted, the signal can have a second value. In some embodiments, the second value can be opposite the first value. For example, in some embodiments, a signal that is asserted can have a high value (e.g., a high voltage, a high binary value) and can be changed to a low value (e.g., a low voltage, a low binary value) when the signal is deasserted. In some embodiments, a power-on-reset signal can be referred to as a reset impulse.

The power-on-reset circuit 100 can be configured to assert the power-on-reset signal 20 (and cause the target circuit 140 to remain in a reset state) while the power supply voltage 10 is at a voltage below which the target circuit 140 can reliably operate. After the power supply voltage 10 rises to a voltage at which the target circuit 140 can reliably operate, the power-on-reset circuit 100 can be configured to deassert the power-on-reset signal 20 (e.g., change the power-on-reset signal 20 from the high value to a low value) so that the target circuit 140 can engage in (e.g., resume) normal operation in, for example, a known state (e.g., a reset state, a normal operational state).

As another example, if the power supply voltage 10 falls from a voltage at which the target circuit 140 can reliably operate to a voltage at which the target circuit 140 may not reliably operate, the power-on-reset circuit 100 can be configured to assert the power-on-reset signal 20 (e.g., change the power-on-reset signal 20 from a low value to a high value, change the power-on-reset signal 20 from a high value to a low value). The power-on-reset circuit 100 can be configured to deassert the power-on-reset signal 20 while the power supply voltage 10 returns to a voltage at which the target circuit 140 can reliably operate and engage in (e.g., resume) normal operation.

A voltage (e.g., the power supply voltage 10) at which the power-on-reset circuit 100 changes from asserting the power-on-reset signal 20 to deasserting the power-on-reset signal 20 can be referred to as a transition voltage. For example, the power-on-reset circuit 100 can be configured to assert or deassert the power-on-reset signal 20 when the power supply voltage 10 crosses a transition voltage.

As shown in FIG. 1, the power-on-reset circuit 100 includes a first voltage detect circuit 110 and a second voltage detect circuit 120 (which can be collectively referred to as voltage detect circuits 115). The first voltage detect circuit 110 and the second voltage detect circuit 120 can be operably coupled to a combination circuit 130. The combination circuit 130 is configured to produce the power-on-reset signal 20 of the power-on-reset circuit 100 based on a logical combination of an output signal 30 produced by the first voltage detect circuit 110 and an output signal 40 produced by the second voltage detect circuit 120. Specifically, the combination circuit 130 can be configured to assert/deassert the power-on-reset signal 20 of the power-on-reset circuit 100 based on a logical combination of an assertion/deassertion (e.g., a high value, a low value) of the output signal 30 produced by the first voltage detect circuit 110 and an assertion/deassertion (e.g., a high value, a low value) of the output signal 40 produced by the second voltage detect circuit 120.

The first voltage detect circuit 110 can be configured to monitor a set of conditions of the power supply voltage 10 that is different than a set of conditions monitored by the second voltage detect circuit 120. Because the power-on-reset signal 20 produced by the power-on-reset circuit 100 is a logical combination of the output signal 30 produced by the first voltage detect circuit 110 and the output signal 40 produced by the second voltage detect circuit 120, the power-on-reset signal 20 can be produced by the power-on-reset circuit 100 based on a combination of the set of conditions monitored by the first voltage detect circuit 110 and the set of conditions monitored by the second voltage detect circuit 120. Thus, the power-on-reset circuit 100 can be configured to produce the power-on-reset signal 20 based on a wider range of conditions of the power supply voltage 10 and/or a higher level of reliability then could be achieved by the first voltage detect circuit 110 or the second voltage detect circuit 120 alone. In some embodiments, the set of conditions (or a portion thereof) monitored by the first voltage detect circuit 110 can be mutually exclusive from (or substantially mutually exclusive from), or overlap with the set of conditions (or portions thereof) monitored by the second voltage detect circuit 120.

For example, the first voltage detect circuit 110 can be configured to monitor the power supply voltage 10 (and produce the output signal 30) over a first range of voltages, and the second voltage detect circuit 120 can be configured to monitor the power supply voltage 10 (and produce the output signal 40) over a second range of voltages different from the first range of voltages. The power-on-reset circuit 100 can be configured to produce (e.g., assert, deassert) the power-on-reset signal 20 over an entire range of voltages of the power supply voltage 10 that includes the first range of voltages and the second range of voltages based on the monitoring performed by the first voltage detect circuit 110 and the second voltage detect circuit 120 over the first range of voltages and the second range of voltages, respectively. In some embodiments, the transition voltage of the first voltage detect circuit 110 within the first range of voltages can be different than (or the same as) the transition voltage of the second voltage detect circuit 120 within the second range of voltages.

Specifically, the first voltage detect circuit 110 can be configured to produce the output signal 30 with a high value until a first transition voltage is exceeded by the power supply voltage 10, and produce the output signal 30 with a low value when the power supply voltage 10 falls below the first transition voltage. The second voltage detect circuit 110 can be configured to produce the output signal 40 with a high value until a second transition voltage (different from the first transition voltage) is exceeded by the power supply voltage 10, and produce the output signal 40 with a low value when the power supply voltage 10 falls below the second transition voltage. The combination circuit 130 can be configured to assert the power-on-reset signal when the output signal 30 or the output signal 40 has a high value, and can be configured to deassert the power-on-reset signal when the output signal 30 and the output signal 40 have a low value. In some embodiments, the first transition voltage and the second transition voltage can be equal (or substantially equal). In other words, the transition voltages of the first voltage detect circuit 110 and the second voltage detect circuit 120 can be the same (or approximately the same).

As another example, the first voltage detect circuit 110 can be a real voltage level detector configured to monitor an absolute value of the power supply voltage 10 of the power supply 150. Accordingly, the first voltage detect circuit 110 can be configured to monitor the power supply voltage 10 of the power supply 150 and produce the output signal 30 relatively independent of a slew rate of the power supply voltage 10. The second voltage detect circuit 120 can be configured to function as a slew rate detector configured to monitor a ramp rate of the power supply voltage 10 of the power supply 150.

When one or more of the voltage detect circuits 115 of the power-on-reset circuit 100 are monitoring the power supply voltage 10 of the power supply 150, the voltage detect circuit(s) can be referred to as being in a monitoring state, or as being in an active state. Conversely, when the voltage detect circuit(s) is not monitoring the power supply voltage 10, the voltage detect circuit(s) can be referred to as being in a non-monitoring state, or as being in an inactive state. One or more of the voltage detect circuits 115 of the power-on-reset circuit 100 can be referred to as being deactivated when changing from monitoring state to a non-monitoring state, and can be referred to as being activated when changing from a non-monitoring state to a monitoring state.

In some embodiments, one or more portions of the power-on-reset circuit 100 may also be non-functional when in a non-monitoring state. For example, the first voltage detect circuit 110 may be non-functional when the power supply voltage 10 is below a first voltage. The first voltage detect circuit 110 will also be in a non-monitoring state because the first voltage detect circuit 110 will not be functional. After the power supply voltage 10 exceeds the first voltage, the first voltage detect circuit 110 may be functional, but may remain in a non-monitoring state until the power supply voltage 10 exceeds a second voltage (higher than the first voltage). A voltage at which at least a portion of the power-on-reset circuit 100 may be configured to change from a functional state to a non-functional state can be referred to as a functional threshold voltage.

In some embodiments, the voltage detect circuits 115 of the power-on-reset circuit 100 can be configured to interact with (e.g., trigger functionality of, send one or more signals to) one another. For example, in some embodiments, the second voltage detect circuit 120 can be configured to deactivate the monitoring functionality of the first voltage detect circuit 110, and vice versa. In some embodiments, the second voltage detect circuit 120 can be configured to deactivate the monitoring functionality of the first voltage detect circuit 110 so that the first voltage detect circuit 110 does not source current while the second voltage detect circuit 120 is monitoring the power supply voltage 10 of the power supply 150. In some embodiments, a delay can be introduced between the first voltage detect circuit 110 and the second voltage detect circuit 120 so that, for example, the monitoring functionality of the first voltage detect circuit 110 will not be entirely deactivated before the monitoring functionality of the second voltage detect circuit 120 is activated, and vice versa.

In some embodiments, the voltage detect circuits 115 of the power-on-reset circuit 100 can be configured to operate (i.e., monitor) over different voltage ranges of the power supply voltage 10 of the power supply 150 so that the overall power consumption of the power-on-reset circuit 100 can be lower than if the voltage detect circuits 115 of the power-on-reset circuit 100 operate over the same (or substantially overlapping) voltage ranges of the power supply voltage 10. Accordingly, each of the voltage detect circuits 115 of the power-on-reset circuit 100 can be configured to monitor only portions of the operating voltage range of the power supply 150. For example, the first voltage detect circuit 110 can be configured to operate (e.g., monitor) over a first range of voltages of the power supply voltage 10, and the second voltage detect circuit 120 can be configured to operate (e.g., monitor) over a second range of voltages of the power supply voltage 10. Thus, the power consumption of the power-on-reset circuit 100 can be lower than if the first voltage detect circuit 110 and/or the second voltage detect circuit 120 are configured to operate over the first range of voltages and the second range of voltages. In some embodiments, the first range of voltages of the power supply voltage 10 and the second range of voltages of the power supply voltage 10 can be mutually exclusive (or substantially mutually exclusive), or can overlap.

In some embodiments, monitoring of the voltage detect circuits 115 of the power-on-reset circuit 100 over different voltage ranges of the power supply voltage 10 of the power supply 150 can be triggered by interactions between the voltage detect circuits 115. For example, the first voltage detect circuit 110 can be in a monitoring state over a first voltage range of the power supply voltage 10. When the power supply voltage 10 exceeds an upper bound of the first voltage range, the first voltage detect circuit 110 can be configured to trigger the second voltage detect circuit 120 to change from a non-monitoring state to a monitoring state. Accordingly, the second voltage detect circuit 120 can be configured to monitor the power supply voltage 10 starting at approximately the upper bound of the first voltage range associated with the first voltage detect circuit 110. The upper bound of the first voltage range can be approximately a lower bound of a second voltage range over which the second voltage detect circuit 120 monitors the power supply voltage 10. In response to changing from the non-monitoring state to the monitoring state, the second voltage detect circuit 120 can be configured to trigger the first voltage detect circuit 110 to change from a monitoring state to a non-monitoring state. Thus, the first voltage detect circuit 110 can be configured to stop monitoring the power supply voltage 10 at approximately the upper bound of the first voltage range of the power supply voltage 10. Because the first voltage detect circuit 110 and the second voltage detect circuit 120 may be actively monitoring the power supply voltage 10 over different voltage ranges, the power consumption of the power-on-reset circuit 100 can be lower than if the first voltage detect circuit 110 and the second voltage detect circuit 120 are actively monitoring over the same (or substantially overlapping) voltage ranges of the power supply voltage 10.

In some embodiments, the operating current of the first voltage detect circuit 110, when in the monitoring state, can be different than (e.g., higher than) the operating current of the second voltage detect circuit 120, when in the monitoring state. For example, the operating current of the first voltage detect circuit 110 (when in the monitoring state) can be greater than a microamp (e.g., 2 microamps) and the operating current of the second voltage detect circuit 120 (when in the monitoring state) can be less than a microamp (e.g., 100 nanoamps). The operating current of the first voltage detect circuit 110 and/or the second voltage detect circuit 120 when in a non-monitoring state can be significantly lower than the operating current of the first voltage detect circuit 110 and/or the second voltage detect circuit 120 when in the monitoring state. For example, the operating current of the first voltage detect circuit 110 and/or the second voltage detect circuit 120 when in a non-monitoring state can be approximately a leakage current.

In some embodiments, the voltage detect circuits 115 of the power-on-reset circuit 100 can be configured to operate based on different power levels. For example, the first voltage detect circuit 110 can be configured to consume, while monitoring the power supply voltage 10, more power than power that is consumed by the second voltage detect circuit 120, while monitoring the power supply voltage 10.

As shown in FIG. 1, the power-on-reset circuit 100 and the target circuit 140 are configured to operate based on power provided by the power supply 150. In other words the power-on-reset circuit 100 and the target circuit 140 are configured to operate based on a common power supply (i.e., power supply 150). Because the voltage detect circuits 115 of the power-on-reset circuit 100 may not both concurrently monitor the power supply voltage 10 of the power supply 150, power that would otherwise be consumed by monitoring performed by the power-on-reset circuit 100 (if the voltage detect circuits 115 both concurrently monitored the power supply voltage 10) can be reserved for operation of the target circuit 140.

Although not shown in FIG. 1, the power-on-reset circuit 100 can include more voltage detect circuits 115 than the first voltage detect circuit 110 and the second voltage detect circuit 120. For example, the power-on-reset circuit 100 can include a peak voltage detect circuit configured to monitor a set of conditions of the power supply voltage 10 that is different than a set of conditions of the power supply voltage 10 monitored by the first voltage detect circuit 110 or the second voltage detect circuit 120.

Although not shown in FIG. 1, multiple power-on-reset circuits such as power-on-reset circuit 100 can be configured to monitor a power supply voltage such as the power supply voltage 10 produced by power supply 150. For example, a first power-on-reset circuit can be configured to produce a first power-on-reset signal that is redundant to a second power-on-reset signal produced by a second power-on-reset circuit. In some embodiments, the first power-on-reset circuit can be configured to assert (or deassert) the first power-on-reset signal at a power supply voltage different than a power supply voltage configured to trigger the second power-on-reset circuit to assert (or deassert) the second power-on-reset signal.

The target circuit 140 can be any type of circuit (or portion thereof) configured to operate based on a power supply voltage such as the power supply voltage 10 produced by the power supply 150. For example, the target circuit 140 can be a microprocessor, a logic module, a digital signal processor (DSP), a logic gate, an application-specific integrated circuit (ASIC), a field programmable gate array (FPGA), and/or so forth. In some embodiments, the target circuit 140 can be any combination of a digital circuit and an analog circuit.

Figure 2A:
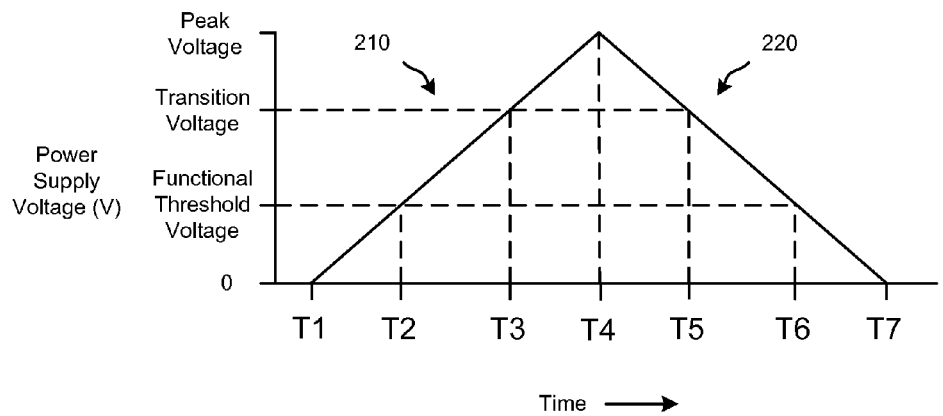
FIG. 2A is a graph that illustrates a behavior of a power supply voltage coupled to a power-on-reset circuit.
Figure 2B:
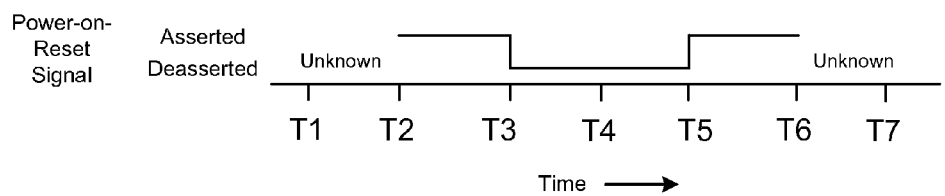
FIG. 2B is a graph that illustrates a power-on-reset signal produced by the power-on-reset circuit in response to the power supply voltage shown in FIG. 2A.
Figure 2C:
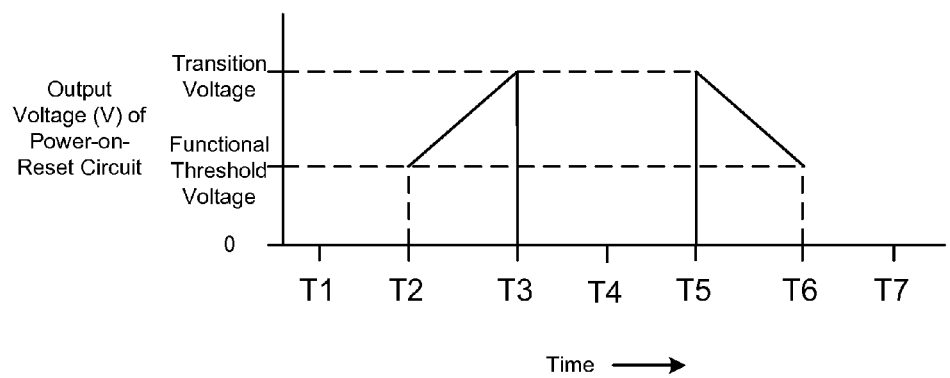
FIG. 2C is a graph that illustrates the output voltage of the power-on-reset circuit that corresponds with the power-on-reset signal shown in FIG. 2B.
Figure 2D:
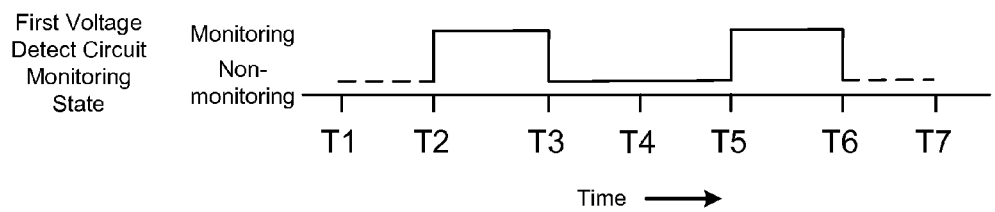
FIG. 2D is a graph that illustrates monitoring states of a first voltage detect circuit.
Figure 2E:
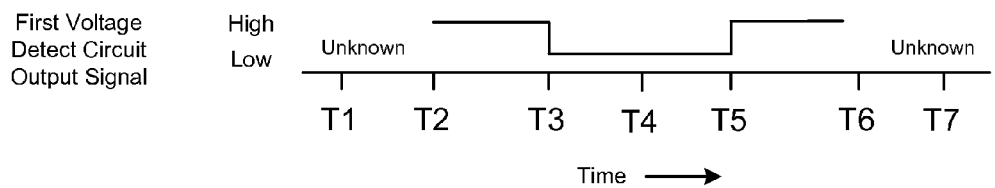
FIG. 2E is a graph that illustrates an output signal corresponding with the monitoring states of the first voltage detect circuit shown in FIG. 2D.
Figure 2F:
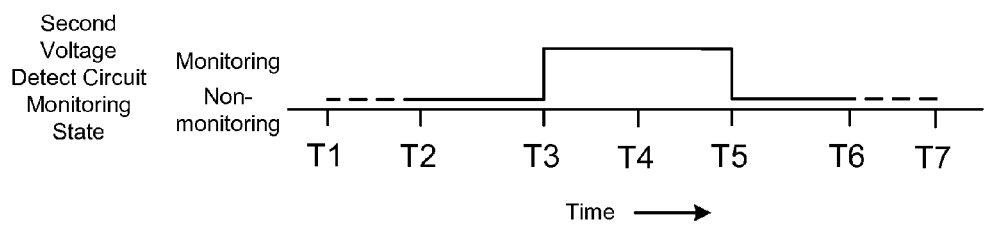
FIG. 2F is a graph that illustrates monitoring states of a second voltage detect circuit.
Figure 2G:
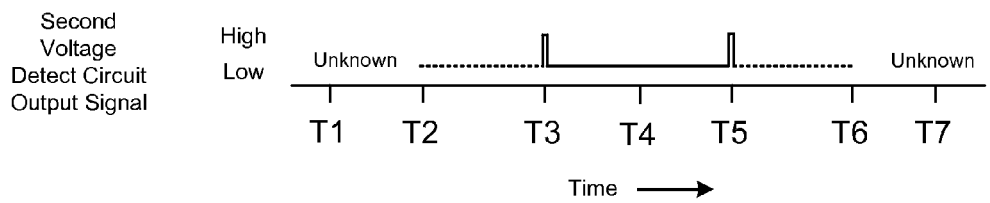
FIG. 2G is a graph that illustrates an output signal corresponding with the monitoring states of the second voltage detect circuit shown in FIG. 2F.

FIGS. 2A through 2G are graphs that illustrate functionality related to a power-on-reset circuit. Specifically, the figures illustrate the behavior of a power supply voltage produced by a power supply (shown in FIG. 2A) and the behavior of voltage detect circuits of a power-on-reset circuit in response to the power supply voltage (shown in FIGS. 2B through 2G). Specifically, FIGS. 2D and 2E are related to a first voltage detect circuit of the power-on-reset circuit (e.g., the first voltage detect circuit 110 shown in FIG. 1), and FIGS. 2F and 2G are related to a second voltage detect circuit of the power-on-reset circuit (e.g., the second voltage detect circuit 120 shown in FIG. 1). As shown in FIGS. 2A through 2G, time is increasing to the right. In some embodiments, the power supply voltage can be a power supply voltage produced by, for example, the power supply 150 shown in FIG. 1, and the power-on-reset circuit can be, for example, the power-on-reset circuit 100 shown in FIG. 1.

Although the behavior of the power-on-reset circuit (and components thereof) are described in connection with FIGS. 2A through 2G as making transitions at specified voltages and at specified times, when implemented (e.g., implemented using Metal Oxide Semiconductor Field Effect Transistor (MOSFET) devices), the transitions of components of the power-on-reset circuit may occur slightly before or slightly after the specified voltages and/or specified times. Specifically, variations in threshold voltages, processing variations, temperature variations, switching speeds of devices, circuit transition delays, and/or so forth can result in conditions (e.g., non-ideal conditions) that can trigger transitions of components of the power-on-reset circuit slightly before or slightly after the specified voltages. More details related to specific circuit configurations of the power-on-reset circuit and the behavior thereof are described below.

FIG. 2A is a graph that illustrates a behavior of a power supply voltage coupled to a power-on-reset circuit. Specifically, the graph illustrates ramping up 210 of the power supply voltage from 0 V (starting at time T1) to a peak voltage (at time T4), and the graph also illustrates ramping down 220 of the power supply voltage from the peak voltage (at time T4) to 0 V (at time T7). As shown in FIG. 2A, the power supply voltage is at (e.g., crosses) a functional threshold voltage at time T2 while ramping up 210, and is at (e.g., crosses) the functional threshold voltage at time T6 while ramping down 220. Also, the power supply voltage is at (e.g., crosses) a transition voltage at time T3 while ramping up 210, and is at (e.g., crosses) the transition voltage at time T5 while ramping down 220.

In this embodiment, when the power supply voltage is below the functional threshold voltage the power-on-reset circuit is in a non-functional state. In this embodiment, the first voltage detect circuit and the second voltage detect circuit have approximately the same transition voltage, which is shown in FIG. 2A. Thus, the first voltage detect circuit and the second voltage detect circuit are configured to assert/deassert respective output signals at approximately the transition voltage shown in FIG. 2A. The transition voltage can approximately correspond with a power supply voltage at which a target circuit can reliably operate.

In some embodiments, the functional threshold voltage can be approximately equal to a threshold voltage of n-channel MOSFET devices included in the target circuit (and included in the power-on-reset circuit). When the power supply voltage is below the threshold voltage of the n-channel MOSFET devices the target circuit (and included in the power-on-reset circuit) may not be functional. The transition voltage can be approximately equal to the threshold voltage of n-channel MOSFET devices (i.e., nfets) plus an absolute value of a threshold voltage of p-channel MOSFET devices (i.e., pfets) included in the target circuit (and included in the power-on-reset circuit). When the power supply voltage is above the threshold voltage of n-channel MOSFET devices plus the absolute value of the threshold voltage of p-channel MOSFET devices the target circuit (and included in the power-on-reset circuit) may reliably operate.

FIG. 2B is a graph that illustrates a power-on-reset signal produced by the power-on-reset circuit in response to the power supply voltage shown in FIG. 2A. As shown in FIG. 2B, the power-on-reset signal is at an unknown value below the functional threshold voltage (between times T1 and T2, and between times T6 and T7) because the components of the power-on-reset circuit may not be functional below the functional threshold voltage.

When the power supply voltage is ramping up (shown at 210 in FIG. 2A) from the functional threshold voltage to the transition voltage between times T2 and T3, the power-on-reset signal is asserted by the power-on-reset circuit. The power-on-reset signal is deasserted at approximately time T3 as the power supply voltage exceeds the transition voltage. When the power supply voltage is ramping down (shown at 220 in FIG. 2A) from the transition voltage to the functional threshold voltage between times T5 and T6, the power-on-reset signal is once again asserted by the power-on-reset circuit.

The power-on-reset circuit can be configured to assert the power-on-reset signal to cause a target circuit (not shown) to remain in a known state (e.g., a reset state) between the functional threshold voltage and the transition voltage. After the power supply voltage produced by the power supply has exceeded the transition voltage, the power-on-reset circuit can be configured to deassert the power-on-reset signal so that the target circuit can resume typical operation. Thus, as soon as the power-on-reset circuit is functional (when the power supply voltage is at or above the functional threshold voltage) the power-on-reset signal can be asserted. The power-on-reset signal can be deasserted when the power supply voltage is approximately at the transition voltage, which is the power supply voltage at which the target circuit may reliably operate.

In this embodiment, the power-on-reset signal shown in FIG. 2B is an "OR" combination of an output signal produced by the first voltage detect circuit of the power-on-reset circuit (e.g., the first voltage detect circuit 120 shown in FIG. 1) and an output signal produced by the second voltage detect circuit of the power-on-reset circuit (e.g., the second voltage detect circuit 120 shown in FIG. 1). Specifically, in this embodiment, the power-on-reset signal is asserted when the output signal produced by the first voltage detect circuit of the power-on-reset circuit or the output signal produced by the second voltage detect circuit of the power-on-reset circuit are a high value (or are asserted). The power-on-reset signal is deasserted when the output signal produced by the first voltage detect circuit of the power-on-reset circuit and the output signal produced by the second voltage detect circuit of the power-on-reset circuit are a low value (or deasserted). The behavior of the first voltage detect circuit and the second voltage detect circuit of the power-on-reset circuit are described in connection with FIGS. 2D through 2G.

The target circuit, similar to the power-on-reset circuit, may not be functional when the power supply voltage is below the functional threshold voltage because the target circuit may be produced based on the same (or similar) semiconductor devices as the power-on-reset circuit. Accordingly, the power-on-reset circuit does not need to produce a power-on-reset signal with a known value below the functional threshold voltage (between times T1 and T2, and between times T6 and T7).

FIG. 2C is a graph that illustrates the output voltage of the power-on-reset circuit that corresponds with the power-on-reset signal shown in FIG. 2B. As shown in FIG. 2C, the output voltage of the power-on-reset circuit tracks the ramping up 210 of the power supply voltage (shown in FIG. 2A) between times T2 and T3 and tracks the ramping down 220 of the power supply voltage (also shown in FIG. 2A) between times T5 and T6. Also, as shown in FIG. 2C, the voltage of the power-on-reset circuit is at zero between times T3 and T5 when the power-on-reset signal is deasserted (shown in FIG. 2B). Accordingly, the output voltage of the power-on-reset circuit does not increase to the peak voltage shown in FIG. 2A.

In this embodiment, the output voltage of the power-on-reset circuit is not shown below the functional threshold voltage (between times T1 and T2, and between times T6 and T7) because the output voltage of the power-on-reset circuit can fluctuate. In some embodiments, the output voltage of the power-on-reset circuit below the functional threshold voltage can approximately track the power supply voltage below the functional threshold voltage (on both the ramping up 210 side and the ramping down 220 side) shown in FIG. 2A.

FIG. 2D is a graph that illustrates monitoring states of a first voltage detect circuit. The first voltage detect circuit is in a monitoring state when the power supply voltage (shown in FIG. 2A) is between the functional threshold voltage and the transition voltage. Accordingly, the first voltage detect circuit is in a monitoring state between times T2 and T3 and between times T5 and T6 (as shown in FIG. 2D). The first voltage detect circuit is in a non-monitoring state when the power supply voltage is below the functional threshold voltage and above the transition voltage. Accordingly, the first voltage detect circuit is in a non-monitoring state between times T1 and T2, between times T3 and T5, and between times T6 and T7 (as shown in FIG. 2D). In this embodiment, the first voltage detect circuit may be in a non-monitoring and non-functional state (illustrated by the dashed lines) when the power supply voltage is below the functional threshold voltage. Accordingly, the first voltage detect circuit may be non-monitoring and non-functional between times T1 and T2, and between times T6 and T7.

In this embodiment, the first voltage detect circuit may be in a non-functional state when the power supply voltage is below the functional threshold voltage because the voltage is too low for the first voltage detect circuit to function in a reliable fashion. The first voltage detect circuit may be in the non-monitoring state when the power supply voltage (shown in FIG. 2A) is above the transition voltage because the first voltage detect circuit may be changed to the non-monitoring state by the second voltage detect circuit. The first voltage detect circuit may be changed back to the monitoring state by the second voltage detect circuit when the power supply voltage (shown in FIG. 2A) falls below the transition voltage. In other words, the second voltage detect circuit can trigger the first voltage detect circuit to change from the monitoring state to the non-monitoring state at approximately time T3, and change from the non-monitoring state monitoring state at approximately time T5. In some embodiments, current to at least a portion of the first voltage detect circuit may be changed (e.g., limited, increased) by the second voltage detect circuit so that the first voltage detect circuit changes between the monitoring state and the non-monitoring state.

FIG. 2E is a graph that illustrates an output signal corresponding with the monitoring states of the first voltage detect circuit shown in FIG. 2D. The output signal of the first voltage detect circuit is a high value (e.g., is in a high state, is asserted) when the power supply voltage (shown in FIG. 2A) is between the functional threshold voltage and the transition voltage. Accordingly, the output signal of the first voltage detect circuit is the high value between times T2 and T3 and between times T5 and T6 (as shown in FIG. 2E). When the power supply voltage exceeds the transition voltage (at time T3), the output signal of the first voltage detect circuit changes from the high value to a low value (e.g., is in a low state, is deasserted). The output signal of the first voltage detect circuit remains at a low value until the power supply voltage falls below the transition voltage (at time T5). When the power supply voltage falls below the transition voltage, the output signal of the first voltage detect circuit changes from the low value to the high value. In this embodiment, the output signal of the first voltage detect circuit is an unknown value when the power supply voltage is below the functional threshold voltage (between times T1 and T2, and between times T6 and T7) because the first voltage detect circuit may be entirely non-functional.

The first voltage detect circuit can be configured so that the output signal from the first voltage detect circuit changes from the high value to the low value at the transition voltage. Thus, the first voltage detect circuit can be configured to change its output from the high value to low value at the transition voltage, which is approximately the same point at which the first voltage detect circuit changes from the monitoring state to the non-monitoring state.

FIG. 2F is a graph that illustrates monitoring states of a second voltage detect circuit. The second voltage detect circuit is in a monitoring state when the power supply voltage is above the transition voltage (shown in FIG. 2A). Accordingly, the second voltage detect circuit is in a monitoring state between times T3 and T5 (as shown in FIG. 2F). The second voltage detect circuit is in a non-monitoring state when the power supply voltage (shown in FIG. 2A) is between the functional threshold voltage and the transition voltage. Accordingly, the second voltage detect circuit is in a non-monitoring state between times T1 and T3 and between times T5 and T7 (as shown in FIG. 2F). In this embodiment, the second voltage detect circuit may be in a non-monitoring and non-functional state (illustrated by the dashed lines) when the power supply voltage is below the functional threshold voltage. Accordingly, the second voltage detect circuit may be non-monitoring and non-functional between times T1 and T2, and between times T6 and T7.

In this embodiment, the second voltage detect circuit may be in a non-functional state when the power supply voltage is below the functional threshold voltage because the voltage is too low for the second voltage detect circuit to function in a reliable fashion. The second voltage detect circuit may be in the non-monitoring state when the power supply voltage (shown in FIG. 2A) is between the functional threshold voltage and the transition voltage because current may not be permitted to flow through at least a portion of the second voltage detect circuit (e.g., a bias generation circuit of the second voltage detect circuit) between the functional threshold voltage and the transition voltage.

In some embodiments, the first voltage detect circuit can be configured to trigger the second voltage detect circuit to change from the non-monitoring state to monitoring state at time T3, and trigger the second voltage detect circuit to change from the monitoring state to the non-monitoring state at time T5. In some embodiments, the first voltage detect circuit may be configured to trigger or terminate current flow in the second voltage detect circuit to change the monitoring state of the second voltage detect circuit. In some embodiments, the first voltage detect circuit can be configured to trigger current flow in the second voltage detect circuit when the output signal of the first voltage detect circuit changes from the high value to the low value (as shown in FIG. 2E). Similarly, the first voltage detect circuit can be configured to terminate (or limit) current flow in the second voltage detect circuit when the output signal of the first voltage detector circuit changes from the low value to the high value (as shown in FIG. 2E).

As shown in FIGS. 2D and 2F, the first voltage detect circuit and the second voltage detect circuit are in monitoring states during mutually exclusive time periods (or substantially mutually exclusive time periods). In some embodiments, the power-on-reset circuit can be configured so that the monitoring states of the first voltage detect circuit and the monitoring states of the second voltage detect circuit have at least some overlap (i.e., have overlapping time periods), or are occurring during the same time periods.

In some embodiments, a delay can be inserted into the power-on-reset circuit so that the monitoring states of the first voltage detect circuit and the monitoring states of the second voltage detect circuit have at least some overlap. In such embodiments, the monitoring states of the first voltage detect circuit and the second voltage detect circuit can overlap so that glitches (e.g., undesirable interruptions) in the power-on-reset signal can be avoided (or substantially avoided). For example, if the first voltage detect circuit is configured to trigger the second voltage detect circuit to change from a non-monitoring state to a monitoring state (at time T3 shown in FIG. 2F) in response to the output signal of the first voltage detect circuit changes from the high value to the low value (as shown in FIG. 2E), the change in the output signal of the first voltage detect circuit can be delayed so that the power-on-reset signal produced by the power-on-reset circuit will not change (based on the changing output signal of the first voltage detect circuit) until the second voltage detect circuit is changed from the non-monitoring state to the monitoring state.

FIG. 2G is a graph that illustrates an output signal corresponding with the monitoring states of the second voltage detect circuit shown in FIG. 2F. As shown in FIG. 2G, the output signal of the second voltage detect circuit is at a high value (e.g., is in a high state, is asserted) approximately when the power supply voltage is at the transition voltage. Accordingly, the output signal of the second voltage detect circuit is the high value at approximately times T3 and T5 (as shown in FIG. 2G). As shown in FIG. 2G, the output signal of the second voltage detect circuit is at a low value at all other times between T2 and T6. In this embodiment, the output signal of the second voltage detect circuit is an unknown value when the power supply voltage is below the functional threshold voltage (between times T1 and T2, and between times T6 and T7) because the second voltage detect circuit may be entirely (or substantially) non-functional. The output signal of the second voltage detect circuit and is shown as a dashed line between times T2 and T3, and between times T5 and T6, because the output signal is being produced by the second voltage detect circuit while the second voltage detect circuit is in a non-monitoring state.

The second voltage detect circuit can be configured so that the output signal from the second voltage detect circuit is at the high value at the transition voltage. Thus, the second voltage detect circuit can be configured to change its output from the low value to the high value at approximately the transition voltage, which is approximately the same point at which the second voltage detect circuit changes from the non-monitoring state to the monitoring state.

In some embodiments, the first voltage detect circuit can be configured to change from the non-monitoring state to the monitoring state at approximately time T5 in response to the output signal of the second voltage detect circuit changing from the low value to the high value. Thus, the power-on-reset signal may be asserted (as shown in FIG. 2B), while the power supply voltage is ramping down 220 (shown in FIG. 2A), based on the high value of the output signal of the second voltage detect circuit alone at approximately time T5. After the power-on-reset signal has been asserted, the first voltage detect circuit may be changed to the monitoring state from the non-monitoring state (in response to the high-value of the output signal of the second voltage detect circuit) and may produce the output signal having the high value as shown in FIG. 2E.

As discussed above, the power-on-reset signal shown in FIG. 2B is an "OR" combination of the output signal produced by the first voltage detect circuit (shown in FIG. 2E) and the output signal produced by the second voltage detect circuit (shown in FIG. 2G). Accordingly, when the output signal of the first voltage detect circuit is a high value (e.g., an asserted value) starting at time T2 (shown in FIG. 2E), the power-on-reset signal shown in FIG. 2B is also asserted starting at time T2 even though the output signal of the second voltage detect circuit is a low value (e.g., a deasserted value) starting at time T2. The time T2 corresponds approximately with the power supply voltage reaching the functional threshold voltage as shown in FIG. 2A. At approximately time T3, the power-on-reset signal (shown in FIG. 2B) continues to be asserted when the power supply voltage is approximately at the transition voltage as shown in FIG. 2A, because the output signal of the first voltage detect circuit is at the high value (shown in FIG. 2D) and the output signal of the second voltage detect circuit is at the high value at approximately time T3 (shown in FIG. 2G). When the power supply voltage exceeds the transition voltage after time T3, the power-on-reset signal (shown in FIG. 2B) is deasserted because the output signal of the first voltage detect circuit is changed to the low value (shown in FIG. 2D) and the output signal of the second voltage detect circuit is also changed to the low value (shown in FIG. 2G). The power-on-reset signal continues to be deasserted (shown in FIG. 2B) when the power supply voltage reaches the peak voltage at time T4 because the output signal of the first voltage detect circuit and the output signal of the second voltage detect circuit continue to be the low value (shown in the FIGS. 2E and 2Q respectively). When the power supply voltage falls below the transition voltage at approximately time T5, the power-on-reset signal is asserted (i.e., reasserted) (shown in FIG. 2B) because the output signal of the second voltage detect circuit is changed from the low value to the high value (shown in FIG. 2G) and the output signal of the first voltage detect circuit is changed from the low value to the high value (shown in FIG. 2D). In some embodiments, the second voltage detect circuit can be changed from the low value to the high value before the first voltage detect circuit is changed from the low value to the high value. The power-on-reset signal continues to be asserted (shown in FIG. 2B) when the power supply voltage reaches the functional threshold voltage at time T6 because the output signal of the first voltage detect circuit continues to be a high value (shown in FIG. 2E) even though the output signal of the second voltage detect circuit is at the low value (shown in FIG. 2G). In such embodiments, the second voltage detect circuit may not be in a monitoring state when producing the low value.

Although not shown in connection with FIGS. 2A through 2G, in some embodiments, the voltage detect circuits of the power-on-reset circuit described in connection with FIGS. 2A through 2G can have different transition voltages. More details related to such an embodiment are described in connection with FIG. 3. Although not shown in connection with FIGS. 2A through 2G, in some embodiments, the power-on-reset circuit (and portions thereof) can be configured to operate in response to a power supply voltage that ramps up and/or ramps down in a non-linear fashion (e.g., can have some noise, an erratic fashion, a fluctuating fashion).

In some embodiments, power-on-reset circuit can be configured so that the first voltage detect circuit and the second voltage detect circuit are in a monitoring state at different times than shown in FIGS. 2A through 2G. For example, the first voltage detect circuit can be in a monitoring state at one or more time periods between time T3 and T5. Also, the first voltage detect circuit can be in a non-monitoring state during at least a portion of time between times T2 and T3 and/or between times T5 and T6. Similarly, the second voltage detect circuit can be in a monitoring state at one or more time periods between times T2 and T3 and/or between times T3 and T6. Also, the second voltage detect circuit can be in a non-monitoring state during at least a portion of time between times T3 and T5.

Figure 3:
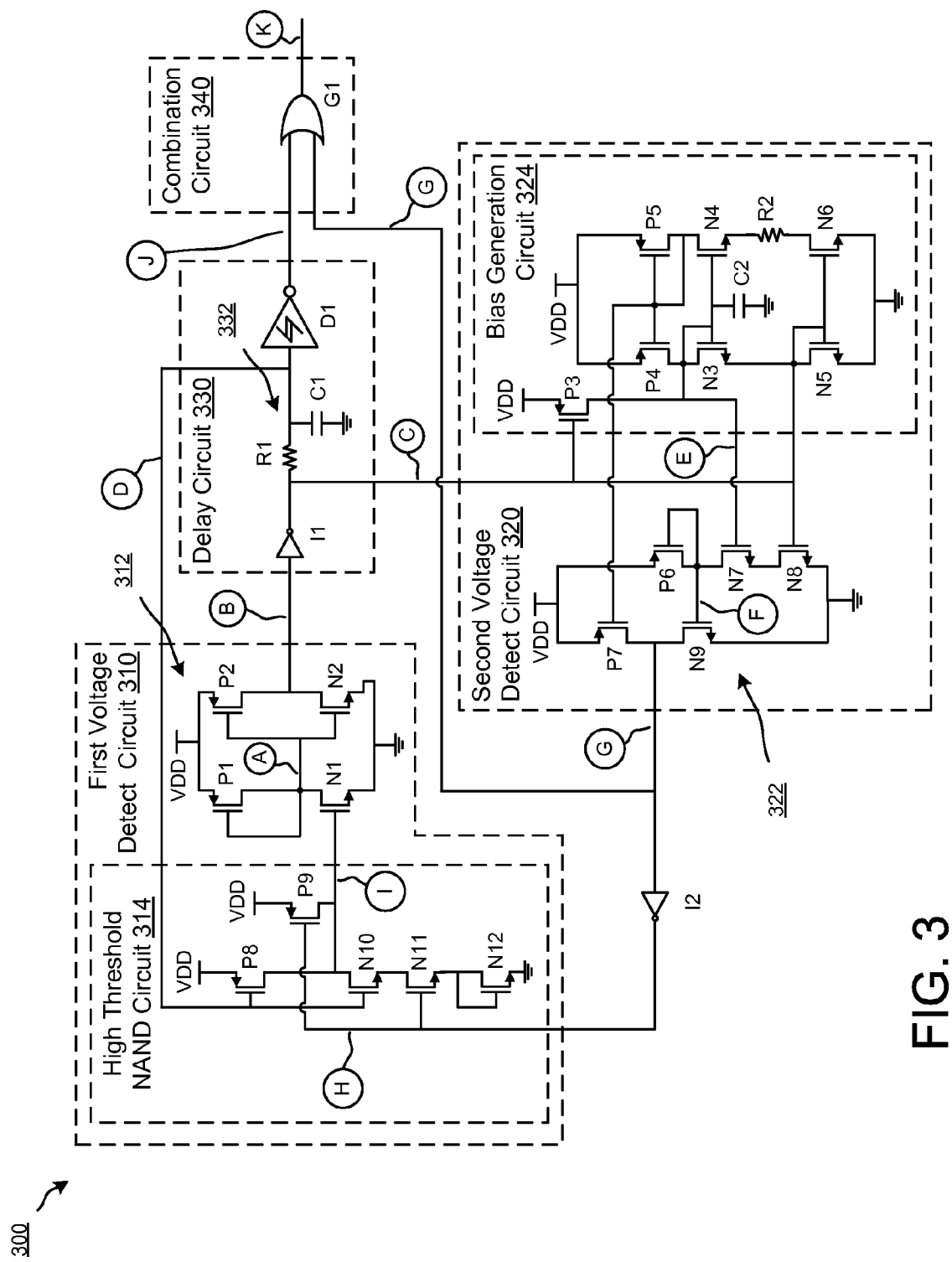
FIG. 3 illustrates a circuit diagram of a power-on-reset circuit that includes a first voltage detect circuit and a second voltage detect circuit.

FIG. 3 illustrates a circuit diagram of a power-on-reset circuit 300 that includes a first voltage detect circuit 310 and a second voltage detect circuit 320. The first voltage detect circuit 310 includes a voltage detect portion 312 operably coupled to a high threshold NAND circuit 314. The second voltage detect circuit 320 includes a voltage detect portion 322 operably coupled to a bias generation circuit 324. The power-on-reset circuit 300 also includes a delay circuit 330 and a combination circuit 340. The power-on-reset circuit 300 is configured to produce (e.g., assert, deassert) a power-on-reset signal at net K.

The voltage detect portion 312 of the first voltage detect circuit 310 includes a diode connected p-channel MOSFET device P1 that has a drain coupled to a drain of an n-channel MOSFET device N1. (The p-channel MOSFET devices can be referred to as pfets, and the n-channel MOSFET devices can be referred to as nfets.) The connected drains of pfet P1 and nfet N1 are an input (shown as net A) to an inverter defined by pfet P2 and nfet N2. An output of the first voltage detect circuit 310 is shown as net B. An output signal of the first voltage detect circuit 310 can be produced on the output shown as net B. In some embodiments, the voltage detect portion 312 of the first voltage detect circuit 310 can have a different configuration (e.g., different transistors) than that shown in FIG. 3.

In this embodiment, at least a portion of the power-on-reset circuit 300 is configured to be functional at a functional threshold voltage approximately equal to a threshold voltage of an nfet (Vthn) (e.g., a threshold voltage of nfet N1) included in the power-on-reset circuit 300. Specifically, the first voltage detect circuit 310 can be configured to function starting approximately at the functional threshold voltage. In some embodiments, the threshold voltages of each of the nfets included in the power-on-reset circuit 300 can be approximately the same. In some embodiments, the threshold voltage of the nfets can each be referred to as an nfet threshold voltage.

As shown in FIG. 3, the high threshold NAND circuit 314, which has an output (shown as net I) into the gate of pfet N1, includes three nfets connected in series (nfets N10 through N12) and two pfets connected in parallel (i.e., pfet P8 and pfet P9). As shown in FIG. 3, nfet N12 is a diode connected nfet. In some embodiments, the high threshold NAND circuit 314 can be configured to set up the state of the first voltage detect circuit 310 as the power supply voltage VDD ramps from zero to approximately the functional threshold voltage. In some embodiments, if the state of the first voltage detect circuit 310 is not set up before the power supply voltage VDD ramps from zero to approximately the functional threshold voltage, the power-on-reset circuit 300 could erroneously deassert the power-on-reset signal at net K. The high threshold NAND circuit 314 can be configured to turn-off the nfet N1 (and limit current to the voltage detect portion 312) so that the first voltage detect circuit 310 changes from a monitoring state to a non-monitoring state. In some embodiments, a typical NAND circuit can be implemented instead of the high threshold NAND circuit 314. In some embodiments, the NAND circuit can be replaced by any type of circuit that can be used to set up the state of the first voltage detect circuit 310 and change the monitoring state of the first voltage detect circuit 310.

A first input into the high threshold and circuit 314, which is coupled to the gate of pfet P8 and the gate of nfet N10, is shown as net D. Net D is an output from the delay circuit 330. The output from the delay circuit 330 is an inverted output of the first voltage detect circuit 310 (shown as net B) after an R-C delay circuit 332 including resistor R1 and capacitor C1. The output of the first voltage detect circuit 310 is inverted into the input of the high threshold NAND circuit 314 (shown as net D) by inverter I1.

A second input of the high threshold and circuit 314, which is coupled to the gate of pfet P9 and the gate of nfet N11, is shown as net H. Net H is an inverted output of the second voltage detect circuit 320 shown as net G. The output of the second voltage detect circuit 320 is inverted into the input shown as net H by inverter I2. When net D and net H both have a high value, the high threshold NAND circuit 314 is configured to turn-off the nfet N1 by setting node I to a low value and change the first voltage detect circuit 310 from a monitoring state to a non-monitoring state.

The voltage detect portion 322 of the second voltage detect circuit 320 includes a diode connected pfet P6 that has a drain coupled to a drain of nfet N7, which is connected in series with nfet N8. The drain of the diode connected pfet P6 is coupled (shown as net F) to nfet N9, which has a drain coupled to a drain of pfet P7. An output of the second voltage detect circuit 320 is shown as net G. In some embodiments, the voltage detect portion 322 of the second voltage detect circuit 320 can have a different configuration (e.g., different transistors) than that shown in FIG. 3

As shown in FIG. 3, a bias generation circuit 324, which includes pfets P3 through P5 and nfets N3 through N6, is operably coupled to the voltage detect portion 322 of the second voltage detect circuit 320. Specifically, the gate of pfet P4 and the gate and drain of pfet P5 of the bias generation circuit 324 are coupled to the gate of pfet P7 of the voltage detect portion 322 of the second voltage detect circuit 320. The drain of pfet P3 and the gates of nfets N3 and N4 are coupled to the gate of nfet N7. Also, the gates of nfet N5 and nfet N6 are coupled to the gate of nfet N8. In some embodiments, the bias generation circuit 324 can be configured to trigger current flow through the second voltage detect circuit 320 (e.g., the voltage detect portion 322 of the second voltage detect circuit 320) so that the second voltage detect circuit 320 can monitor the power supply voltage VDD in a desirable fashion. In some embodiments, the bias generation circuit 324 can have a different configuration (e.g., different transistors) than that shown in FIG. 3.

As shown in FIG. 3, an output of the delay circuit 330 (shown as net C) functions as an input into the second voltage detect circuit 320. The output from the delay circuit (shown as net C) is an inverted output of the first voltage detect circuit 310 (shown as net B) before the R-C delay circuit 332. The output of the first voltage detect circuit 310 is inverted into the input shown as net C by inverter I1. As shown in FIG. 3, the delay circuit 330 also includes a Schmidt trigger D1. In some embodiments, the Schmidt trigger D1 can be configured to add hysteresis to voltages at which assertion and deassertion of the power-on-reset signal occur. In some embodiments, the delay circuit 330 can have a different configuration than that shown in FIG. 3.

As shown in FIG. 3, a combination circuit 340 produces the power-on-reset signal (shown as net K) based on an OR logical combination of net J and net G via OR gate G1. The value (e.g., high value, low value) of net J is the same as the value of net B (which is the output of the first voltage detect circuit 310) after a delay caused by the delay circuit 330. As discussed above, net G is the output of the second voltage detect circuit 320. Thus, the power-on-reset signal is an OR logical combination of the output of the first voltage detect circuit 310 (shown as net B) and the output of the second voltage detect circuit 320 (shown as net G).

The power-on-reset circuit 300 shown in FIG. 3 is configured to operate similar to the power-on-reset circuit discussed in connection with FIGS. 2A through 2G. Accordingly, the first voltage detect circuit 310 is configured to function similar to the first voltage detect circuit discussed in connection with FIGS. 2D and 2E, and the second voltage detect circuit 320 is configured to function similar to the second voltage detect circuit discussed in connection with FIGS. 2F and 2G.

In this embodiment, the first voltage detect circuit 310 is configured to produce an output signal (at net B) that transitions between a high value (e.g., an asserted value) and a low value (e.g., a de-asserted value) when the power supply voltage VDD crosses (e.g., exceeds, falls below) a first transition voltage. Similarly, the second voltage detect circuit 320 is configured to produce an output signal (at net G) that transitions between a high value (e.g., an asserted value) and a low value (e.g., a deasserted value) when the power supply voltage VDD crosses (e.g., exceeds, falls below) a second transition voltage. The first transition voltage and the second transition voltage can be approximately equal to a threshold voltage of an nfet plus an absolute value of a threshold voltage of a pfet (Vthn+Vthp) (e.g., a threshold voltage of nfet N1 plus an absolute value of a threshold voltage of pfet P1) included in the power-on-reset circuit 300. In some embodiments, the threshold voltages of each of the pfets included in the power-on-reset circuit 300 can be approximately the same. In some embodiments, the threshold voltage of the pfets can each be referred to as a pfet threshold voltage.

When the power supply voltage VDD is less than Vthn (which is the functional threshold voltage), both the first voltage detect circuit 310 and the second voltage detect circuit 320 are in a non-monitoring state and a nonfunctional state. The first voltage detect circuit 310 and the second voltage detect circuit 320 are nonfunctional because the power supply voltage VDD is not high enough to turn on any of the transistors (nfets or pfets) included in the power-on-reset circuit 300. Accordingly, a voltage of the power-on-reset signal (shown as net K) is based on leakage current through the power-on-reset circuit 300. In some embodiments, the voltage of the power-on-reset signal can approximately track the power supply voltage VDD.

When the power supply voltage VDD is equal to (or approximately equal to) the functional threshold voltage (which can be approximately Vthn), the high threshold NAND circuit 314 is configured to turn on (e.g., activate) nfet N1 so that the voltage detect portion 312 of the first voltage detect circuit 310 will produce an output voltage (at net B) that has a high value (i.e., a value that is approximately equal to the power supply voltage VDD). In this case, the nfet N1 will be sourcing current that can cause net A to be sufficiently low to cause the inverter defined by pfet P2 and nfet N2 to produce an output (e.g., an output voltage) that has a high value. When the power supply voltage VDD is equal to (or approximately equal to) the functional threshold voltage, the first voltage detect circuit 310 will be monitoring the power supply voltage VDD (i.e., the first voltage detect circuit 310 will be in a monitoring state).

When the power supply voltage VDD is at a voltage greater than the functional threshold voltage but less than the first transition voltage and less than the second transition voltage (which can each be approximately equal to Vthn+Vthp), the voltage of net A can be equal to (or approximately equal to) the power supply voltage VDD minus Vthp. Thus, the output of the first voltage detect circuit 310 (at net B) remains at a high value due to the input voltage (at net A), which has a low value, into pfet P2 and pfet N2. Net C, which is inverted by inverter I1, will have a low value while the output (at net B) of the first voltage detect circuit 310 is a high value.

Also, when the power supply voltage VDD is at a voltage between the functional threshold voltage and the first and second transition voltages, the low value of net C will cause P3 to turn on (i.e., will close) and pull the gate voltages of nfets N3 and N4 to a high value to prepare (e.g., to prime) the bias generation circuit 324 to turn on. The bias generation circuit 324, however, will not be activated (e.g., functional) because nfets N5 and N6 will be turned off and current will not be flowing through nfet N7 and nfet N8 of the voltage detect portion 322 of the second voltage detect circuit 320. Accordingly, the second voltage detect circuit 320 will be in a non-monitoring state when the power supply voltage VDD exceeds (while ramping) or is at a voltage greater than the functional threshold voltage but is less than the first and second transition voltages. In some embodiments, the second voltage detect circuit 320 will be in a non-monitoring state when the power supply voltage VDD is less than Vthp+Vds (sat). While in this non-monitoring state, net F of the second voltage detect circuit 320 will be a high value and net G, which is the output of the second voltage detect circuit 320, will be a low value. Because the output of the first voltage detect circuit 310 (at net B) has a high value, net J (which is the output from the delay circuit 330) will also have a high value. Thus, the power-on-reset signal (at net K) from the power-on-reset circuit 330 will have a high value because at least one input of the "OR" gate (i.e., net J) will have a high value when the power supply voltage VDD is at a voltage between the functional threshold voltage and the first and second transition voltages. In some embodiments, the R-C delay circuit 332 can be configured to ensure that during a transition time when the second voltage detect circuit 320 changes to a monitoring state, and the first voltage detect circuit 310 changes to a non-monitoring state, the power-on-reset signal (at net K) will remain high without glitching.

When the power supply voltage VDD crosses the transition voltages, the behavior of the power-on-reset circuit 300 can vary depending on which of the transition voltages is higher and depending on whether the power supply voltage VDD is ramping up or ramping down. Each of these cases will be discussed below.

When the first transition voltage (which is associated with the first voltage detect circuit 310) is less than the second transition voltage (which is associated with a second voltage detect circuit 320) and the power supply voltage VDD exceeds the first transition voltage but is below the second transition voltage, net B and net J (which is after the R-C delay circuit 332) will change from a high value to a low value, and net C and net D (which is after the R-C delay circuit 332) will both change from a low value to a high value. In response to net C changing to a high value, nfets N8, N5, and N6 will turn on (i.e., will close) and the bias generation circuit 324 will start to function and current will flow in nfets N3 through N8. Because the bias generation circuit 324 is functional, the second voltage detect circuit 320 will change from a non-monitoring state to a monitoring state, and the output (at net G) of the second voltage detect circuit 320 will be a high value. Thus, the power-on-reset signal (at net K) from the power-on-reset circuit 330 will have a high value because the output of the second voltage detect circuit 320 will have a high value.

As the power supply voltage VDD continues to ramp up and finally exceeds the second transition voltage, the output (at net G) of the second voltage detect circuit 320 will change from a high value to a low value. Thus, the power-on-reset signal (at net K) from the power-on-reset circuit 330 will have a low value because both the output of the first voltage detect circuit 310 and the second voltage detect circuit 320 will have a low value. At this point, net H (which has a value inverted by I2 from the low value of at net G) will be a high value that causes, in conjunction with high value of net D, the high threshold NAND circuit 314 to turn off N1 and change the first voltage detect circuit 310 to a non-monitoring state.

When the first transition voltage (which is associated with the first voltage detect circuit 310) is greater than the second transition voltage (which is associated with a second voltage detect circuit 320) and the power supply voltage VDD exceeds the second transition voltage but is below the first transition voltage, the output (at net G) of the second voltage detect circuit 320 will be at a low value. In this scenario, the bias generation circuit 324 will not yet be started by the first voltage detect circuit 310 because the first transition voltage will not yet be reached and net C will have a low value. Thus, the bias generation circuit 324 will not be functional before the power supply voltage VDD ramps above the second transition voltage. In this variation, during ramping up of the power supply voltage VDD, the second voltage detect circuit 320 will not generate a high output and could not generate a high output because the bias generation circuit 324 will not be cause current to flow in the second voltage detect circuit 320 until after the first transition voltage is exceeded. Nfet N1 in the first voltage detect circuit 310 will not be turned off by the second voltage detect circuit 320 because the second voltage detect circuit 320 would not be in a monitoring state, and the output of the first voltage detect circuit 310 will continue to be a high value. Thus, the power-on-reset signal (at net K) from the power-on-reset circuit 330 will have a high value because at least one input of the "OR" gate (i.e., net J) will have a high value.

The power-on-reset signal (at net K) would finally go low when the power supply voltage VDD ramps above the first transition voltage. At this point, the power-on-reset signal (at net K) from the power-on-reset circuit 330 will have a low value because both the output of the first voltage detect circuit 310 and the second voltage detect circuit 320 will have a low value. Although the second voltage detect circuit 120 will not produce an output (at net G) with a high value during ramping of the power supply voltage VDD in this scenario, the second voltage detect circuit 320 will be changed to a monitoring state when the power supply voltage VDD exceeds the first transition voltage so that the first voltage detect circuit 310 produces an output (at net B) that triggers (through net C) the bias generation circuit 324 to cause current to flow in in nfets N3 through N8 of the second voltage detect circuit 320. In this scenario, the second voltage detect circuit 320 will produce an output (at net G) having a low value when the second voltage detect circuit 320 changes from the non-monitoring state to the monitoring state. Net H (which has a value inverted by I2 from the low value of at net G) will be a high value that causes, in conjunction with high value of net D, the high threshold NAND circuit 314 to turn-off N1 and change the first voltage detect circuit 310 to a non-monitoring state.

When the power supply voltage VDD exceeds the first and second transition voltages only the second voltage detect circuit 320 will be monitoring the power supply voltage VDD. The first voltage detect circuit 310 will be in a non-monitoring state. The power-on-reset signal (at net K) produced by the power-on-reset circuit 300 will be a low value.

When the second transition voltage is greater than the first transition voltage and the power supply voltage VDD ramps down and falls below the second transition voltage, the second voltage detect circuit 320 can be configured to produce a high output value at net G. The high output value at net G will cause the power-on-reset signal (at net K) to be asserted (e.g., a high-value) because at least the output value at net G will be high. Also, the high output value at net G will be inverted to a low value at net H, which will cause the first voltage detect circuit 310 to change to a monitoring state.

As the power supply voltage VDD continues to ramp down and falls below the first transition voltage, the first voltage detect circuit 320 can be configured to produce a high output value at net B, and trigger a high value at net J. At this point, both of the inputs into the OR gate G1 will have a high-value. The high output value at net B will be inverted by inverter I1 as a low value at net C, which will change the second voltage detect circuit 320 from a monitoring state to a non-monitoring state.

Alternatively, when the first transition voltage is greater than the second transition voltage and the power supply voltage VDD ramps down and falls below the first transition voltage, the first voltage detect circuit 320 will not produce a high output value at net B because the first voltage detect circuit 320 will not be in a monitoring state. The power-on-reset signal (at net K) will not be changed to a high-value until the power supply voltage VDD ramps down and falls below the second transition voltage, at which time, the second voltage detect circuit 320 can be configured to produce a high output value at net G. The high output value at net G will cause the power-on-reset signal (at net K) to be asserted (e.g., a high-value) because at least the output value at net G will be high. Also, the high output value at net G will be inverted to a low value at net H, which will cause the first voltage detect circuit 310 to change to a monitoring state. Because the power supply voltage will already be below the first transition voltage, the first voltage detect circuit 320 can be configured to produce a high output value at net B, and trigger a high value at net J. At this point, both of the inputs into the OR gate G1 will have a high-value. The high output value at net B will be inverted by inverter I1 as a low value at net C, which will change the second voltage detect circuit 320 from a monitoring state to a non-monitoring state.

As described above, when the power supply voltage VDD is ramping down, the second voltage detect circuit 320 will cause the power-on-reset signal (at net K) to be asserted even in cases where the first transition voltage is greater than the second transition voltage. The power-on-reset circuit 300 behaves in this fashion because the first voltage detect circuit 310 will not be in a monitoring state when the power supply voltage VDD is above the first transition voltage and the second transition voltage.

Consistent with the description above, in some embodiments, the power-on-reset signal at net K can be deasserted only when the first transition voltage and the second transition voltage are both exceeded when the power supply voltage VDD is ramping up. When the power supply voltage VDD is ramping down, the power-on-reset signal at net K may only be asserted when the power supply voltage VDD falls below the second transition voltage. Accordingly, when the first transition voltage is higher than the second transition voltage, the power-on-reset signal at net K will be asserted at a higher voltage (i.e., at the first transition voltage) as the power supply voltage VDD is ramping up than a voltage (i.e., the second transition voltage) at which the power-on-reset signal a net K will be asserted as the power supply voltage VDD is ramping down. Thus, the power-on-reset circuit 300 can assert/deassert the power-on-reset signal at net K with a hysteresis. However, in some embodiments, when the first transition voltage is lower than the second transition voltage, the power-on-reset signal at net K will be asserted as the power supply voltage VDD is ramping up and deasserted as the power supply voltage VDD is ramping down at approximately the second transition voltage.

Although not shown in FIG. 3, in some embodiments one or more portions of the power-on-reset circuit 300 can be implemented using devices other than nfet devices and pfet devices. For example, one or more portions of the power-on-reset circuit 300 can be implemented using a bipolar junction transistor (BJT) device, diode devices, junction field effect transistor (JFET) devices, and/or so forth.

Figure 4:
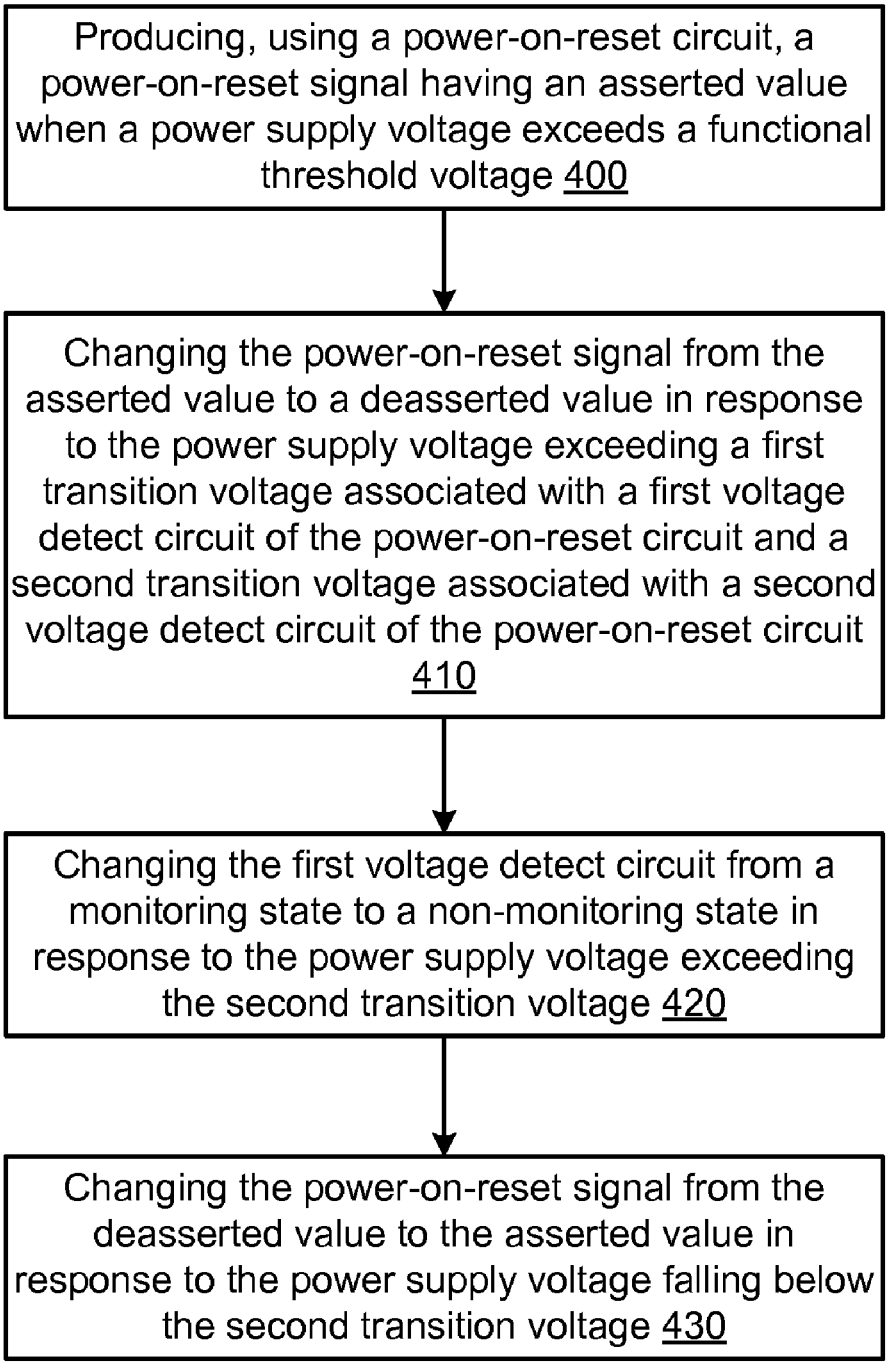
FIG. 4 is a flowchart that illustrates a method for producing a power-on-reset signal.

FIG. 4 is a flowchart that illustrates a method for producing a power-on-reset signal. As shown in FIG. 4, a power-on-reset signal having an asserted value is produced, using a power-on-reset circuit, when a power supply voltage exceeds a functional threshold voltage (block 400). In some embodiments, the power supply voltage can also be coupled to a target circuit. In some embodiments, the functional threshold voltage can be equal to (e.g., approximately equal to) a threshold voltage of an n-channel MOSFET device of the power-on-reset circuit.

The power-on-reset signal is changed from the asserted value to a deasserted value in response to the power supply voltage exceeding a first transition voltage associated with a first voltage detect circuit of the power-on-reset circuit and a second transition voltage associated with a second voltage detect circuit of the power-on-reset circuit (block 410). In some embodiments, the first transition voltage can be different than (e.g., higher than, lower than) the second transition voltage. In some embodiments, the first transition voltage and/or the second transition voltage can be approximately equal to a threshold voltage of an n-channel MOSFET device plus an absolute value of a p-channel MOSFET device included in the power-on-reset circuit. In some embodiments, the first voltage detect circuit can include a high threshold NAND circuit. In some embodiments the second voltage detect circuit can include a bias generation circuit.

The first voltage detect circuit is changed from a monitoring state to a non-monitoring state in response to the power supply voltage exceeding the second transition voltage (block 420). In some embodiments, the first voltage detect circuit can be triggered to change from the monitoring state to the non-monitoring state in response to an output signal (e.g., an output signal having an asserted value) produced by the second voltage detect circuit. The second voltage detect circuit can be configured to produce the output signal in response to the power supply voltage exceeding the second transition voltage. In some embodiments, the second voltage detect circuit can be in a non-monitoring state until the first transition voltage is exceeded. In such embodiments, the second voltage detect circuit can be triggered to change from the non-monitoring state to a monitoring state in response to an output signal (e.g., an output signal having asserted value) produced by the first voltage detect circuit. The first voltage detect circuit can be configured to produce the output signal in response to the power supply voltage exceeding the first transition voltage.

The power-on-reset signal is changed from the deasserted value to the asserted value in response to the power supply voltage falling below the second transition voltage. In some embodiments, the first transition voltage can be higher than the second transition voltage. In such embodiments, the first voltage detect circuit can be in the non-monitoring state when the changing of the power-on-reset signal from the deasserted value to the asserted value is performed.

In some embodiments, the power-on-reset circuit can be configured so that the power-on-reset circuit can produce a power-on-reset signal over a wide range of power supply voltage ramp rates. In other words, the transient characteristics of the power-on-reset circuit (which are shown in, for example, FIGS. 2A through 2G) can be substantially the same over a wide range of power supply voltage ramp rates. For example, the behavior of the voltage detect circuits of the power-on-reset circuit (and the overall operation of the power-on-reset circuit) can be substantially the same even when cycling (e.g., a ramp up and a ramp down cycle between 0 V to a peak voltage) of the power supply voltage varies between nanoseconds (e.g., 10 nanoseconds, 100 nanoseconds) and seconds (e.g., 5 seconds), or even minutes (e.g., 100 minutes, 1000 minutes).

Figure 5A:
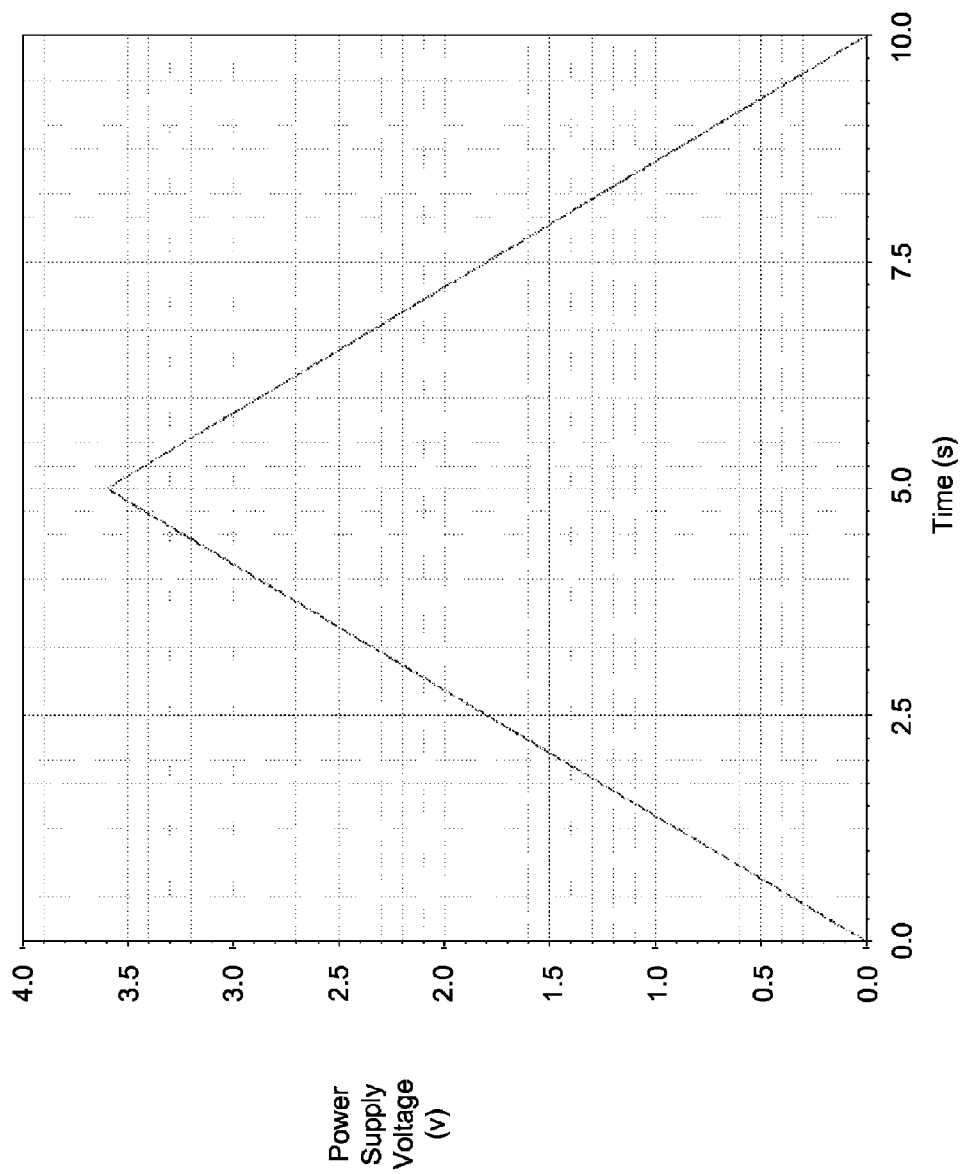
FIG. 5A is a graph that illustrates a power supply voltage, according to an embodiment.

FIG. 5A is a graph that illustrates a power supply voltage, according to an embodiment. As shown in FIG. 5A, the power supply voltage is configured to linearly ramp up 510 from 0 V to approximately 3.6 volts in 5 seconds (between 0 seconds and 5 seconds) and is configured to linearly ramp down 520 from 3.6 V to 0 V in 5 seconds (between 5 seconds and 10 seconds).

Figure 5B:
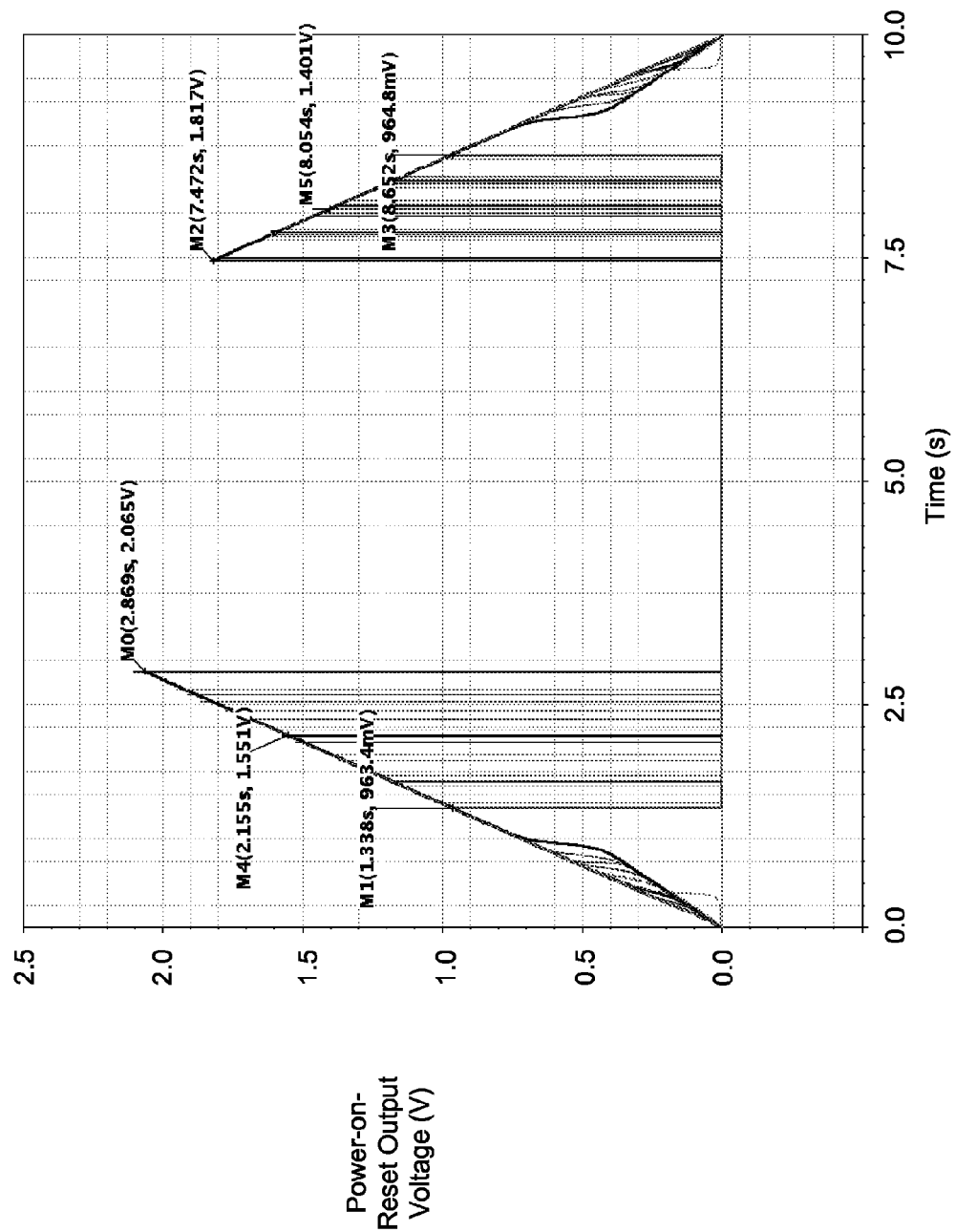
FIG. 5B is a graph that illustrates simulated traces of a power-on-reset voltage produced by a power-on-reset circuit in response to the power supply voltage shown in FIG. 5A.

FIG. 5B is a graph that illustrates simulated traces of a power-on-reset voltage produced by a power-on-reset circuit in response to the power supply voltage shown in FIG. 5A. Specifically, each of the simulated traces of the power-on-reset voltage is produced based on various combinations of semiconductor processing variations and temperature variations. The processing corners illustrated in FIG. 5B include combinations of slow and fast nfet and pfet devices of the power-on-reset circuit as well as temperatures ranging between −40° C. and 125° C. The simulated traces illustrate that as temperature increases and the threshold voltages of the transistor devices of the power-on-reset circuit decrease, the transition voltage(s) of the power-on-reset circuit decrease. As shown in FIG. 5B, the power-on-reset voltage produced by the power-on-reset circuit fluctuates when the power supply voltage (shown in FIG. 5A) is approximately below a threshold voltage of an n-channel device (e.g., approximately below 0.7 V).

Figure 5C:
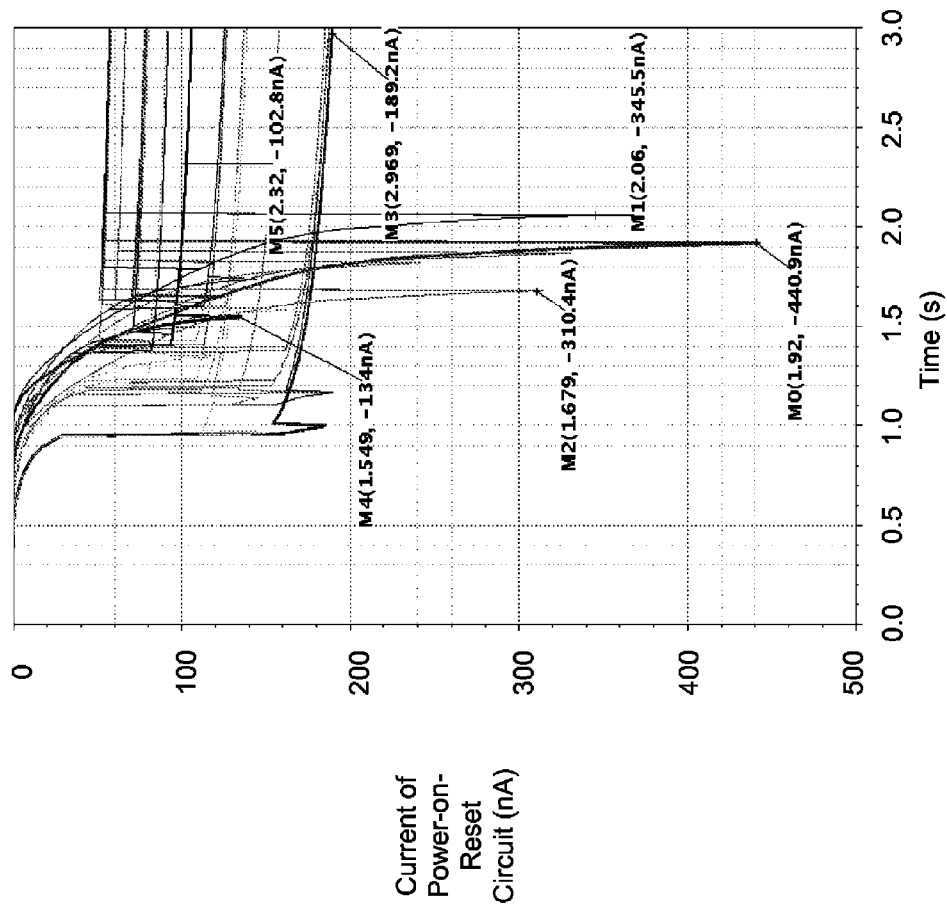
FIG. 5C is a graph that illustrates simulated traces of current through a power-on-reset circuit in response to the power supply voltage shown in FIG. 5A.

FIG. 5C is a graph that illustrates simulated traces of current through a power-on-reset circuit in response to the power supply voltage shown in FIG. 5A. In this graph, current is increasing in a downward direction from 0 nanoamps to 500 nanoamps. Each of the simulated traces of the current through power-on-reset circuit is produced based on various combinations of semiconductor processing variations and temperature variations. As shown in FIG. 5C, the current through the power-on-reset circuit varies between 0 nanoamps and less than 500 nanoamps. The spikes in the simulated traces (and subsequent decreases in current) represent times at which at least a portion of the power-on-reset circuit is changed from a monitoring state to a non-monitoring state.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device (computer-readable medium) or in a propagated signal, for processing by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

In some embodiments, one or more portions of methods may be performed by one or more programmable processors executing a computer program to perform functions by operating on input data and generating output. Portions of methods also may be performed by, and an apparatus may be implemented as, special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a first voltage detect circuit configured to produce an output signal at a first power supply voltage, and configured to be in a non-monitoring state at a second power supply voltage greater than the first power supply voltage;
a second voltage detect circuit configured to change from a non-monitoring state to a monitoring state and configured to produce an output signal at a third power supply voltage between the first power supply voltage and the second power supply voltage; and
a combination circuit configured to produce a power-on-reset signal based on a logical combination of the output signal produced by the first voltage detect circuit and the output signal produced by the second voltage detect circuit.

2. The apparatus of claim 1, wherein the second voltage detect circuit includes a bias generation circuit configured to trigger the second voltage detect circuit to change from a non-monitoring state to a monitoring state when the first power supply voltage changes to the third power supply voltage.

3. The apparatus of claim 1, wherein the first voltage detect circuit and the second voltage detect circuit are in different monitoring states at the first power supply voltage, and the first voltage detect circuit and the second voltage detect circuit are in different monitoring states at the second power supply voltage.

4. The apparatus of claim 1, wherein the second voltage detect circuit is configured to trigger the first voltage detect circuit to change from a monitoring state to a non-monitoring state at the third power supply voltage.

5. The apparatus of claim 1, wherein the first power supply voltage is greater than a threshold voltage of an n-channel MOSFET device included in the first voltage detect circuit, the first voltage detect circuit includes a high threshold voltage NAND circuit configured to cause the n-channel MOSFET device of the first voltage detect circuit to source a current greater than a leakage current of the n-channel MOSFET device sourced by the n-channel MOSFET device at a fourth power supply voltage greater than zero and less than the threshold voltage of the n-channel MOSFET device.

6. The apparatus of claim 1, wherein the first power supply voltage is greater than a threshold voltage of an n-channel MOSFET device included in the first voltage detect circuit, the second voltage detect circuit includes a bias generation circuit configured to trigger an increase in a current through the second voltage detect circuit when the second voltage detect circuit is changed from the non-monitoring state to the monitoring state, the n-channel MOSFET device has a current that is decreased when the second voltage detect circuit is in the monitoring state.

7. The apparatus of claim 1, wherein the first power supply voltage is a functional threshold voltage, the second power supply voltage is a transition voltage of the first voltage detect circuit, the first voltage detect circuit is configured to change the output signal produced by the first voltage detect circuit from an asserted value to a deasserted value when the power supply voltage exceeds the transition voltage of the first voltage detect circuit,
the second voltage detect circuit is configured to change the output signal produced by the first voltage detect circuit from an asserted value to a deasserted value when the power supply voltage exceeds a transition voltage of the second voltage detect circuit, the transition voltage of the second voltage detect circuit being different than the transition voltage of the first voltage detect circuit.

8. The apparatus of claim 1, wherein the second power supply voltage is greater than a threshold voltage of an n-channel MOSFET device plus an absolute value of a threshold voltage of a p-channel MOSFET device included in the first voltage detect circuit, the output signal produced by the second voltage detect circuit has a deasserted value at the second power supply voltage,
the third power supply voltage is equal to the threshold voltage of the n-channel MOSFET device plus the absolute value of the threshold voltage of the p-channel MOSFET device, the output signal produced by the second voltage detect circuit has an asserted value at the third power supply voltage.

9. The apparatus of claim 1, wherein
the output signal produced by the first voltage detect circuit has an asserted value at the first power supply voltage,
the second power supply voltage is greater than the third power supply voltage, the output signal produced by the first voltage detect circuit has the asserted value at the second power supply voltage,
the third power supply voltage is equal to a threshold voltage of an n-channel MOSFET device plus an absolute value of a threshold voltage of a p-channel MOSFET device included in the first voltage detect circuit, the output signal produced by the first voltage detect circuit has a deasserted value at the third power supply voltage.

10. The apparatus of claim 1, wherein the output signal produced by the first voltage detect circuit has an asserted value at the third power supply voltage,
the output signal produced by the second voltage detect circuit has an asserted value at the third power supply voltage,
the power-on-reset signal produced by the combination circuit has an asserted value based on the logical combination of the output signal produced by the first voltage detect circuit having the asserted value and the output signal produced by the second voltage detect circuit having the asserted value.

11. The apparatus of claim 1, wherein the first voltage detect circuit includes a p-channel diode connected MOSFET device that has a drain coupled to a drain of a n-channel MOSFET device, the first voltage detect circuit is in the non-monitoring state when the n-channel MOSFET device is turned off by a high threshold NAND circuit coupled to a gate of the n-channel MOSFET device.

12. An apparatus, comprising:
a first voltage detect circuit including a first p-channel diode connected MOSFET device having a drain coupled to a drain of a first n-channel MOSFET device, the first n-channel MOSFET device has a gate coupled to a high threshold NAND circuit;
a second voltage detect circuit including a second p-channel diode connected MOSFET device and having a gate of a second n-channel MOSFET device coupled to a bias generation circuit; and
a logical combination circuit configured to produce a power-on-reset signal based on a logical combination of a first output signal produced by the first voltage detect circuit based on a power supply voltage and a second output signal produced by the second voltage detect circuit based on the power supply voltage.

13. The apparatus of claim 12, wherein the bias generation circuit is configured to cause the second voltage detect circuit to change to a monitoring state in response to the first output signal produced by the first voltage detect circuit changing to a deasserted value.

14. The apparatus of claim 12, wherein the high threshold NAND circuit is configured to turn-off the first n-channel MOSFET device in response to the second output signal produced by the second voltage detect circuit.

15. The apparatus of claim 12, wherein the high threshold NAND circuit is configured to turn-off the first n-channel MOSFET device when the power supply voltage exceeds a threshold voltage of the first n-channel MOSFET device plus an absolute value of a threshold voltage of the first p-channel MOSFET device.

16. The apparatus of claim 12, wherein the bias generation circuit is configured to cause the second voltage detect circuit to be in a non-monitoring state when the power supply voltage is less than a threshold voltage of the first n-channel MOSFET device plus an absolute value of a threshold voltage of the first p-channel MOSFET device.

17. The apparatus of claim 12, wherein the first voltage detect circuit has an output operably coupled to the high threshold NAND circuit via a first inverter, and operably coupled to the bias generation circuit of the second voltage detect circuit of the first inverter, the output of the first voltage detect circuit is associated with the first output signal, the second voltage detect circuit has an output operably coupled to the high threshold NAND circuit via a second inverter, the output of the second voltage detect circuit is associated with the second output signal.

18. The apparatus of claim 12, further comprising:
a delay circuit including at least one resistor and including at least one capacitor, the delay circuit disposed between the first voltage detect circuit and the logical combination circuit, the delay circuit being coupled to the second voltage detect circuit.

19. A method, comprising:
producing, using a power-on-reset circuit, a power-on-reset signal having an asserted value when a power supply voltage exceeds a functional threshold voltage;
changing the power-on-reset signal from the asserted value to a deasserted value in response to the power supply voltage exceeding a first transition voltage associated with a first voltage detect circuit of the power-on-reset circuit and exceeding a second transition voltage associated with a second voltage detect circuit of the power-on-reset circuit;
changing the second voltage detect circuit from a non-monitoring state to a monitoring state; and
changing the first voltage detect circuit from a monitoring state to a non-monitoring state in response to the changing the second voltage detect circuit from the non-monitoring state to the monitoring state.

20. The method of claim 19, further comprising:
changing the first voltage detect circuit from the monitoring state to the non-monitoring state in response to the power supply voltage exceeding the second transition voltage; and
changing the power-on-reset signal from the deasserted value to the asserted value in response to the power supply voltage falling below the second transition voltage.

21. The method of claim 19, wherein the first transition voltage is higher than the second transition voltage,
the method, further comprising:
changing the power-on-reset signal from the deasserted value to the asserted value in response to the power supply voltage falling below the second transition voltage, the first voltage detect circuit is in the non-monitoring state when the changing of the power-on-reset signal from the deasserted value to the asserted value is performed.

22. The method of claim 19, wherein the first transition voltage is lower than the second transition voltage,
the method further comprising:
changing the second voltage detect circuit from the non-monitoring state to the monitoring state in response to the power supply voltage exceeding the first transition voltage.

23. The method of claim 19, wherein the functional threshold voltage is approximately equal to a threshold voltage of an n-channel MOSFET device included in the power-on-reset circuit, the first transition voltage is approximately equal to the threshold voltage of the n-channel MOSFET device plus an absolute value of a p-channel MOSFET device included in the power-on-reset circuit.

24. A method, comprising:
producing, using a power-on-reset circuit, a power-on-reset signal having an asserted value when a power supply voltage exceeds a functional threshold voltage; and
changing the power-on-reset signal from the asserted value to a deasserted value in response to the power supply voltage exceeding a first transition voltage associated with a first voltage detect circuit of the power-on-reset circuit and exceeding a second transition voltage associated with a second voltage detect circuit of the power-on-reset circuit, the first voltage detect circuit configured to operate over a first range of voltages different than a second range of voltages during which the second voltage detect circuit operates.

25. The method of claim 24, wherein the functional threshold voltage is approximately equal to a threshold voltage of an n-channel MOSFET device included in the power-on-reset circuit, the first transition voltage is approximately equal to the threshold voltage of the n-channel MOSFET device plus an absolute value of a p-channel MOSFET device included in the power-on-reset circuit.

26. The method of claim 24, further comprising:
changing the power-on-reset signal from the deasserted value to the asserted value in response to the power supply voltage falling below the second transition voltage.

27. An apparatus, comprising:
a first voltage detect circuit configured to operate over a first range of voltages including a first transition voltage;
a second voltage detect circuit configured to operate over a second range of voltages different from the first range of voltages including a second transition voltage; and
a combination circuit configured to produce a power-on-reset signal having an asserted value when a power supply voltage exceeds a functional threshold voltage and configured to change the power-on-reset signal from the asserted value to a deasserted value in response to the power supply voltage exceeding the first transition voltage associated with the first voltage detect circuit of the power-on-reset circuit and exceeding the second transition voltage associated with the second voltage detect circuit of the power-on-reset circuit.

28. The apparatus of claim 27, further comprising:
a bias generation circuit configured to cause the second voltage detect circuit to change to a monitoring state in response to a deasserted value of an output signal produced by the first voltage detect circuit.

29. The apparatus of claim 27, wherein the first voltage detect circuit includes a p-channel diode connected MOSFET device has a drain coupled to a drain of an n-channel MOSFET device, the n-channel MOSFET device has a gate coupled to a high threshold NAND circuit.

30. The apparatus of claim 27, further comprising:
a bias generation circuit, the second voltage detect circuit including a p-channel diode connected MOSFET device and having a gate of an n-channel MOSFET device coupled to the bias generation circuit.

31. The apparatus of claim 27, wherein the second voltage detect circuit includes a bias generation circuit configured to trigger the second voltage detect circuit to change from a non-monitoring state to a monitoring state when the power supply voltage changes.

32. The apparatus of claim 27, wherein the first voltage detect circuit and the second voltage detect circuit are in different monitoring states over the first range of voltages.

33. The apparatus of claim 27, wherein the first voltage detect circuit includes a p-channel diode connected MOSFET device that has a drain coupled to a drain of a n-channel MOSFET device, the first voltage detect circuit is in a non-monitoring state when the re-channel MOSFET device is turned off by a high threshold NAND circuit coupled to a gate of the n-channel MOSFET device.

* * * * *

UNITED STATES PATENT AND TRADEMARK OFFICE
CERTIFICATE OF CORRECTION

| | |
|---|---|
| PATENT NO. | : 8,344,767 B2 |
| APPLICATION NO. | : 12/904702 |
| DATED | : January 1, 2013 |
| INVENTOR(S) | : Dong Li et al. |

It is certified that error appears in the above-identified patent and that said Letters Patent is hereby corrected as shown below:

In column 26, line 63, in claim 33, delete "re-channel" and insert -- n-channel --, therefor.

Signed and Sealed this
Twenty-sixth Day of February, 2013

Teresa Stanek Rea
*Acting Director of the United States Patent and Trademark Office*